(12) United States Patent
Brown et al.

(10) Patent No.: US 8,320,420 B2
(45) Date of Patent: Nov. 27, 2012

(54) POLARITY INDEPENDENT LASER MONITOR DIODE CURRENT SENSING CIRCUIT FOR OPTICAL MODULES

(75) Inventors: George W. Brown, San Jose, CA (US); Thomas S. Wong, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 126 days.

(21) Appl. No.: 13/039,297

(22) Filed: Mar. 2, 2011

(65) Prior Publication Data
US 2012/0224598 A1 Sep. 6, 2012

(51) Int. Cl.
*H01S 3/00* (2006.01)
(52) U.S. Cl. ............... 372/38.07; 372/38.02; 372/38.01; 372/29.011; 372/29.015
(58) Field of Classification Search ............... 372/38.07, 372/38.02, 38.01, 29.011, 29.015
See application file for complete search history.

(56) References Cited

U.S. PATENT DOCUMENTS

| | | | | |
|---|---|---|---|---|
| 5,056,097 A | * | 10/1991 | Meyers | ..................... 372/29.014 |
| 7,738,519 B2 | * | 6/2010 | Wong | ......................... 372/38.02 |

* cited by examiner

*Primary Examiner* — Kinam Park
(74) *Attorney, Agent, or Firm* — Van Pelt, Yi & James LLP

(57) ABSTRACT

A laser bias control and monitoring circuit receives a monitor diode current on an input node and generate a bias current for a laser diode on an output node where the monitor diode current flows into (positive polarity) or out of (negative polarity) the input node. The laser bias control and monitoring circuit includes a polarity independent current sensing circuit configured to receive the monitor diode current in either positive or negative polarity and to generate a normalized output current having a magnitude proportional to a magnitude of the monitor diode current. In this manner, the laser bias control and monitoring circuit can be used with laser diode and monitor diode combination in either the common anode or the common cathode configuration, or with the monitor diode current being provided from the anode or cathode of the monitor diode. No reprogramming or reconfiguration of the circuit is required.

19 Claims, 7 Drawing Sheets

Common Anode

Common Cathode $I_{MD}$ referenced to GND $I_{MD}$ referenced to Vdd

POLARITY INDEPENDENT LASER MONITOR DIODE CURRENT SENSING CIRCUIT FOR OPTICAL MODULES

FIELD OF THE INVENTION

The invention relates to a sensing circuit for a laser monitor diode and, in particular, to a sensing circuit for a laser monitor diode that is polarity independent.

DESCRIPTION OF THE RELATED ART

Optical communication systems commonly employ semiconductor lasers or other optical emitters for transmitting light signals indicative of a low data value and a high data value, as represented by different light intensity values. Semiconductor lasers, such as edge emitting lasers (Distributed Feedback (DFB) lasers and Fabry-Perot lasers) and vertical cavity surface emitting lasers (VCSEL), are well known. Semiconductor lasers or optical emitters may be used to form a fiber optics transmitter or an optical transceiver.

A semiconductor laser, also called a laser diode, requires a bias current above a threshold level applied to the laser to turn the laser on so that lasing can occur. Once the laser is turned on, the laser can transmit data signals (high/low values) by receiving a modulation current which operates to modify the optical power emitted by the laser diode. The two levels of the data pattern are usually represented by a large emitted optical power or a small emitted optical power.

Laser bias must be adjusted over time to compensate for variations in the average output power level due to laser aging, temperature variations, and other factors. A Bias-Set signal is usually provided to the laser diode to set the level of the bias current so as to maintain the desired average output power level. Once a specific bias current value is selected, it is often desirable that the laser bias current be maintained at the level required to maintain a constant optical output power value over time. In this manner, the laser output power level is also maintained at the desired level. An automatic power control (APC) circuit, a simple servo loop, is typically used to maintain the optical output power at a constant value by adjusting the bias current. In general, a monitor photodiode (or monitor diode) is placed in close proximity to a laser diode to measure the average output power of the laser diode. The power measured by the monitor diode is then used by the APC circuit to maintain the desired optical output power at the constant value by adjusting the bias current as required.

SUMMARY OF THE INVENTION

According to one embodiment of the present invention, a laser bias control and monitoring circuit is configured to receive a monitor diode current on an input node indicative of the average optical output power of a laser diode and generate a bias current for the laser diode on an output node where the monitor diode current flows into (positive polarity) or out of (negative polarity) the input node. The laser bias control and monitoring circuit includes a polarity independent current sensing circuit configured to receive the monitor diode current in either the positive or negative polarity and to generate a normalized output current having a magnitude proportional to the magnitude of the monitor diode current, a first load circuit configured to convert the normalized output current into a monitor voltage signal, a second load circuit configured to convert a bias set current signal into a bias set voltage signal where the bias set current signal is indicative of a desired value of the bias current generated to bias the laser diode, a comparator configured to compare the monitor voltage signal with the bias set voltage signal where the comparator provides an error signal indicative of the difference between the monitor voltage signal and the bias set voltage signal, and an amplifier configured to receive the error signal and a reference signal and to generate a bias adjust signal for adjusting the bias current for the laser diode.

According to another aspect of the present invention, a method of controlling a bias current of a laser diode includes providing a monitor diode current on an input node indicative of the average optical output power of a laser diode where the monitor diode current flow into (positive polarity) or out of (negative polarity) the input node, receiving the monitor diode current in either positive or negative polarity, generating a normalized output current having a magnitude proportional to a magnitude of the monitor diode current, converting the normalized output current to a monitor voltage signal, providing a bias set voltage signal indicative of a desired value of the bias current generated to bias the laser diode, comparing the monitor voltage signal to the bias set voltage signal to generate an error signal indicative of the difference between the monitor voltage signal and the bias set voltage signal, and generating a bias adjust signal for adjusting the bias current for the laser diode in response to the error signal.

The present invention is better understood upon consideration of the detailed description below and the accompanying drawings.

DETAILED DESCRIPTION OF THE PREFERRED EMBODIMENTS

In accordance with the principles of the present invention, a laser bias control and monitoring circuit coupled to a monitor diode for monitoring the output power level of a laser diode is polarity independent and can accept positive or negative monitor diode current as the input current. More specifically, the laser bias control and monitoring circuit is configured to accept monitor diode current flowing into or out of the current input node of the circuit. In operation, the laser bias control and monitoring circuit normalizes the polarity of the monitor diode current so that the same monitoring circuit can be used whether the laser diode and the monitor diode are configured in the common anode configuration or the common cathode configuration, or whether the monitor diode current is referenced to ground or referenced to the positive power supply. Accordingly, a constant optical power level from the laser diode is maintained.

Figure 1A:
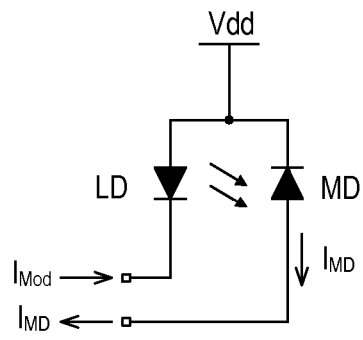
FIGS. 1(a) and 1(b) illustrate the common anode and the common cathode configurations for a laser diode and monitor diode combination.
Figure 1B:
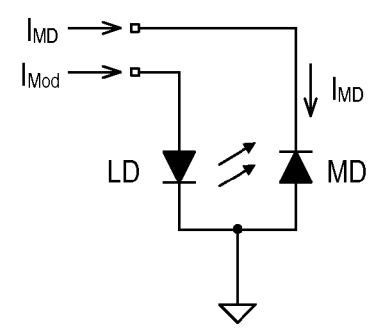
Figure 1C:
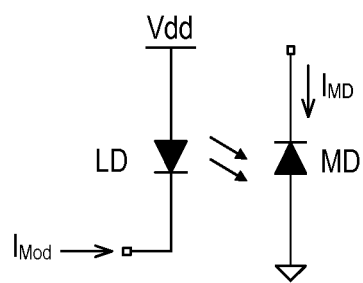
FIGS. 1(c) and 1(d) illustrate the laser diode and monitor diode combinations for the monitor diode current being referenced to ground and referenced to the positive power supply, respectively.
Figure 1D:
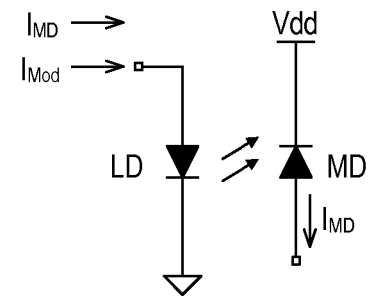

FIGS. 1(a) and 1(b) illustrate the common anode and the common cathode configurations for a laser diode and monitor diode combination. FIGS. 1(c) and 1(d) illustrate the laser diode and monitor diode combinations for the monitor diode current being referenced to ground and referenced to the positive power supply, respectively. Referring to FIGS. 1(a) to 1(d), a laser diode (LD) is disposed in an optical module, such as an optical module used for data transmission. The laser diode receives a modulation current $I_{mod}$ which modifies the optical power emitted by the laser diode for transmitting a desired data pattern. In the optical module, a monitor diode (MD) (or monitor photodiode) is placed in close proximity to the laser diode to measure the laser diode output power level. The monitor diode detects the optical power emitted by the laser diode and generates a monitor diode current $I_{MD}$ in response. This monitor diode current $I_{MD}$ is proportional to the optical power emitted from the laser diode and is to be coupled to a laser diode monitoring circuit (not shown) for use in the automatic power control (APC) circuit. The APC circuit operates to maintain a constant optical output power level from the laser diode. The monitor diode current can be used to detect the magnitude of the optical power or to detect when the optical transceiver is transmitting or not transmitting.

Depending on the configuration of the laser diode/monitor diode, the monitor diode current can be a positive current or a negative current with respect to the flow of the current into or out of the current input node of the monitoring circuit. In the common anode configuration shown in FIG. 1(a), the anode of the laser diode and the cathode of the monitor diode are connected to the positive power supply Vdd. The monitor diode current $I_{MD}$ flows from the anode of the monitor diode into the current input node of the monitoring circuit. In the present description, the flow of the monitor diode current into the current input node of the monitoring circuit is referred to as a positive current. In the common cathode configuration shown in FIG. 1(b), the cathode of the laser diode and the anode of the monitor diode are connected to the negative power supply or to ground. The monitor diode current $I_{MD}$ flows out of the current input node of the monitoring circuit into the cathode of the monitor diode. In the present description, the flow of the monitor diode current out of the current input node of the monitoring circuit is referred to as a negative current.

Besides the common anode and common cathode configurations, other configurations of the laser diode and monitor diode combination are also possible. In some cases, the laser diode and monitor diode may be configured to allow the monitor diode current to be taken from the cathode of the monitor diode or to have the monitor diode current be referenced to ground, as shown in FIG. 1(c). In other cases, the laser diode and monitor diode may be configured to allow the monitor diode current to be taken from the anode of the monitor diode or to have the monitor diode current be referenced to the positive power supply, as shown in FIG. 1(d).

Because the laser diode and monitor diode can be configured in different combinations, the polarity of the monitor diode current becomes dependent on the laser diode/monitor diode combinations. Conventional laser diode monitor circuits are typically configured for monitor diode current that flows in one direction only. Thus, either a separate laser driver or a reconfigurable laser driver is required to handle monitor diode current having opposite current polarities. In accordance with embodiments of the present invention, the laser diode monitoring circuit of the present invention is universal and can work with monitor diode current flowing into or out of the monitoring circuit. No circuit reconfiguration or reprogramming is needed to handle monitor diode current in either polarity.

Figure 2:
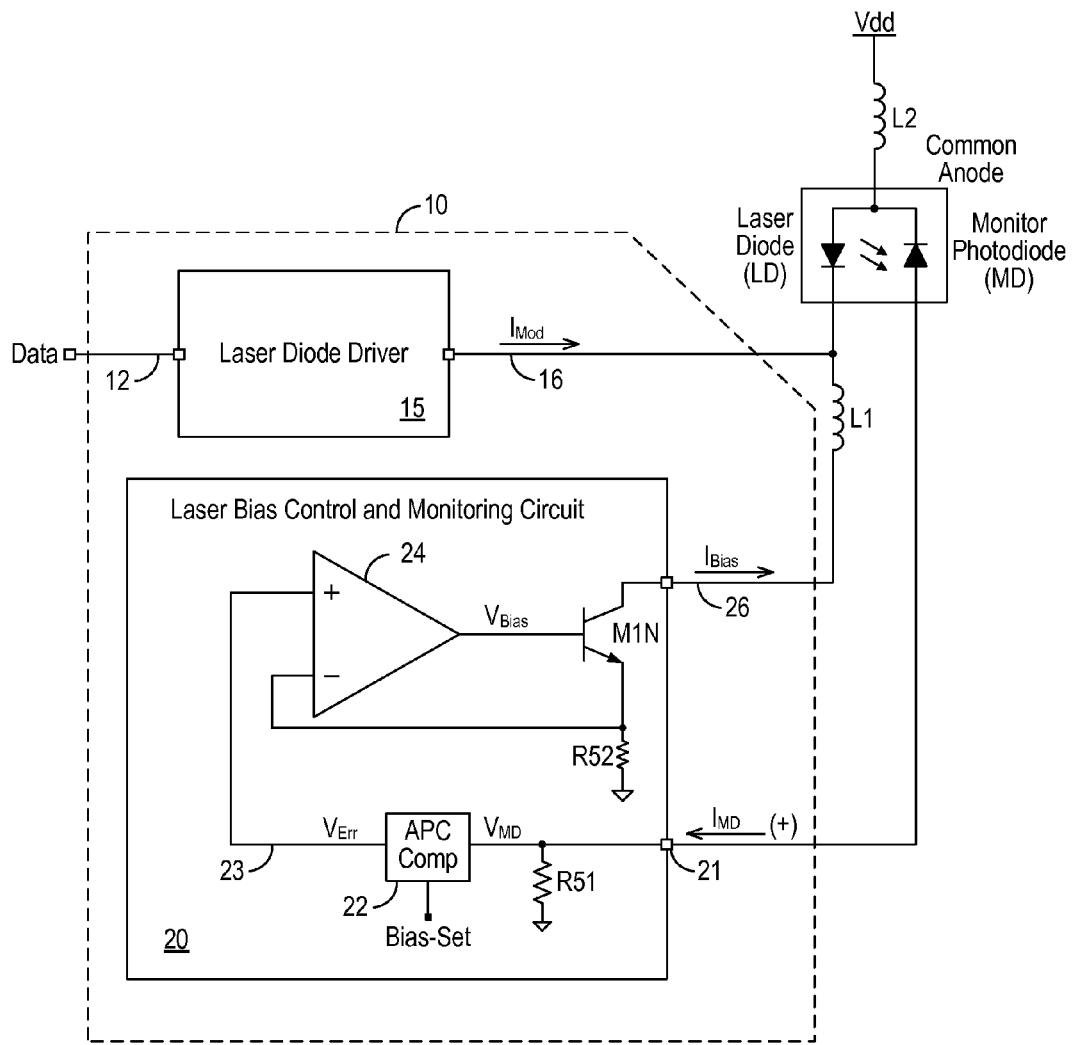
FIG. 2 is a schematic diagram of a conventional laser driver system configured for receiving a positive monitor diode current ($I_{MD}$) using a laser diode in the common anode configuration.

FIG. 2 is a schematic diagram of a conventional laser driver system configured for receiving a positive monitor diode current. Referring to FIG. 2, a laser driver system 10 is coupled to drive a laser diode (LD) to emit output optical signals indicative of a data pattern. A monitor diode (MD) is provided in close proximity to the laser diode to measure the average output power of the laser diode. In FIG. 2, the laser diode and the monitor diode are connected in a common anode configuration. The laser driver system 10 includes a laser diode driver circuit 15 providing a modulation current $I_{Mod}$ (node 16) to modulate the output power of the laser diode in accordance with an input data signal (node 12). The laser driver system 10 also includes a laser bias control and monitoring circuit 20 providing a bias current $I_{Bias}$ (node 26) to bias the laser diode to the desired operating level. The laser bias control and monitoring circuit 20 includes an APC circuit implementing an automatic power control loop to adjust the bias current $I_{Bias}$ to the desired level. In the present embodiment, the laser bias control and monitoring circuit 20 is configured to receive a positive monitor diode current $I_{MD}$ on a current input node 21. That is, the monitor diode current $I_{MD}$ flows into the current input node 21.

More specifically, the APC circuit of monitoring circuit 20 includes an APC comparator 22 receiving a Bias-Set signal indicative of a desired laser bias level and comparing the Bias-Set signal to a signal indicative of the monitor diode current $I_{MD}$. An error signal $V_{Err}$ (node 23) is generated indicative of the difference between the desired bias level and the measured laser output power as indicated by the monitor diode current. An amplifier 24 receives the error signal $V_{Err}$ and a reference signal and generate a bias voltage $V_{Bias}$ coupled to drive the base terminal of a bias drive transistor which is an NPN transistor M1N. The bias voltage $V_{Bias}$ applied to the base terminal of transistor M1N determines the amount of bias current $I_{Bias}$ sourced at the collector terminal (node 26) of transistor M1N to bias the laser diode LD. The current at the emitter terminal of transistor M1N is converted to a voltage by resistor R52 and fed back to amplifier 24 for monitoring and adjusting the bias voltage $V_{Bias}$ applied to the base terminal of transistor M1N.

Figure 3:
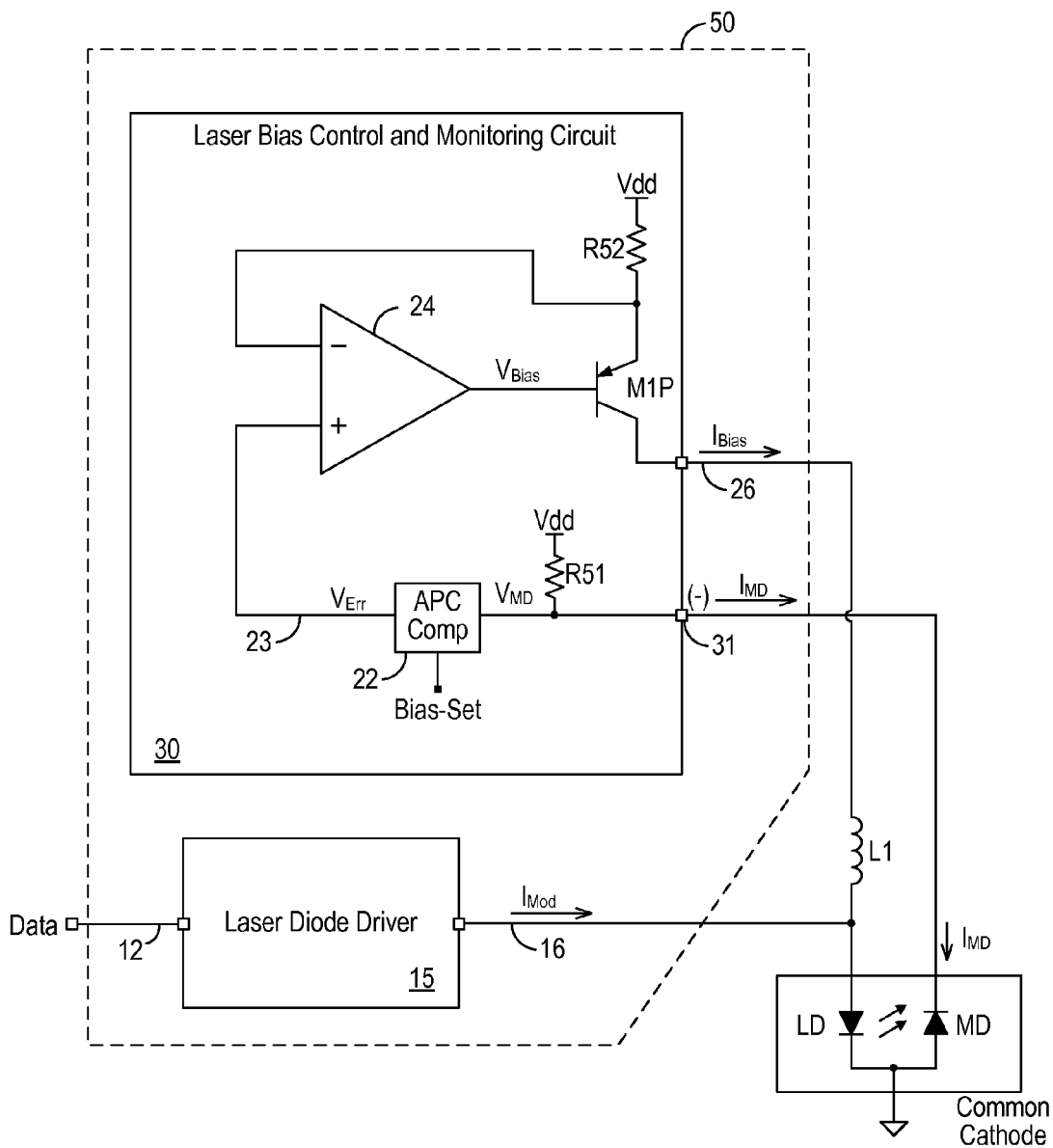
FIG. 3 is a schematic diagram of a conventional laser driver system configured for receiving a negative monitor diode current ($I_{MD}$) using a laser diode in the common cathode configuration.

FIG. 3 is a schematic diagram of a conventional laser driver system configured for receiving a negative monitor diode current. Referring to FIG. 3, a laser driver system 50 is coupled to drive a laser diode (LD) to emit output optical signals indicative of a data pattern. A monitor diode (MD) is provided in close proximity to the laser diode to measure the average output power of the laser diode. In FIG. 3, the laser diode and the monitor diode are connected in a common cathode configuration. The laser driver system 50 includes a laser diode driver circuit 15 providing a modulation current $I_{Mod}$ (node 16) to modulate the output power of the laser diode in accordance with an input data signal (node 12). The laser driver system 50 also includes a laser bias control and monitoring circuit 30 providing a bias current $I_{Bias}$ (node 26) to bias the laser diode to the desired operating level. The laser bias control and monitoring circuit 30 includes an APC circuit implementing an automatic power control loop to adjust the bias current to the desired level as defined by the Bias-Set signal. In particular, the laser bias control and monitoring circuit 30 is configured to receive a negative monitor diode current $I_{MD}$ on a current input node 31. That is, the monitor diode current $I_{MD}$ is actually drawn out or sourced out of the laser bias control and monitoring circuit 30 into the cathode of the monitor diode MD.

More specifically, the APC circuit of monitoring circuit 30 includes an APC comparator 22 receiving a Bias-Set signal indicative of a desired laser bias level and comparing the Bias-Set signal to a signal indicative of the monitor diode current $I_{MD}$. An error signal $V_{Err}$ (node 23) is generated indicative of the difference between the desired bias level and the measured laser output power as indicated by the monitor diode current. An amplifier 24 receives the error signal $V_{Err}$ and a reference signal and generate a bias voltage $V_{Bias}$ coupled to drive the base terminal of a bias drive transistor which is a PNP transistor M1P. The bias voltage $V_{Bias}$ applied to the base terminal of transistor M1P determines the amount of bias current $I_{Bias}$ being sourced at the collector terminal (node 26) of transistor M1P to supply the laser diode LD. The current at the emitter terminal of transistor M1P is converted to a voltage by resistor R52 and is fed back to amplifier 24 for monitoring and adjusting the bias voltage $V_{Bias}$ applied to the base terminal of transistor M1P.

The conventional laser bias control and monitoring circuits 20 and 30 (FIGS. 2 and 3) are specifically configured for receiving either a positive monitor diode current or a negative monitor diode current and thus can only be coupled to laser diode and monitor diode configured in specific configurations. Alternately, reconfiguration or reprogramming of the circuit 20 or 30 is required to allow the monitoring circuit to accept monitor diode current of the opposite polarity.

According to embodiments of the present invention, a laser bias control and monitoring circuit ("monitoring circuit") includes a polarity independent monitor diode current sensing circuit ("sensing circuit") to allow the monitoring circuit to accept monitor diode current in either the positive or the negative polarity, without requiring reconfiguration or reprogramming of the monitoring circuit. Thus, the same monitoring circuit can be applied to different laser diode/monitor diode configurations, including the common anode or the common cathode configuration. Furthermore, the same monitoring circuit can be applied to accept a monitor diode current taken from the cathode or the anode of the monitor diode or a monitor diode current that is referenced to ground or to the positive power supply.

Figure 4:
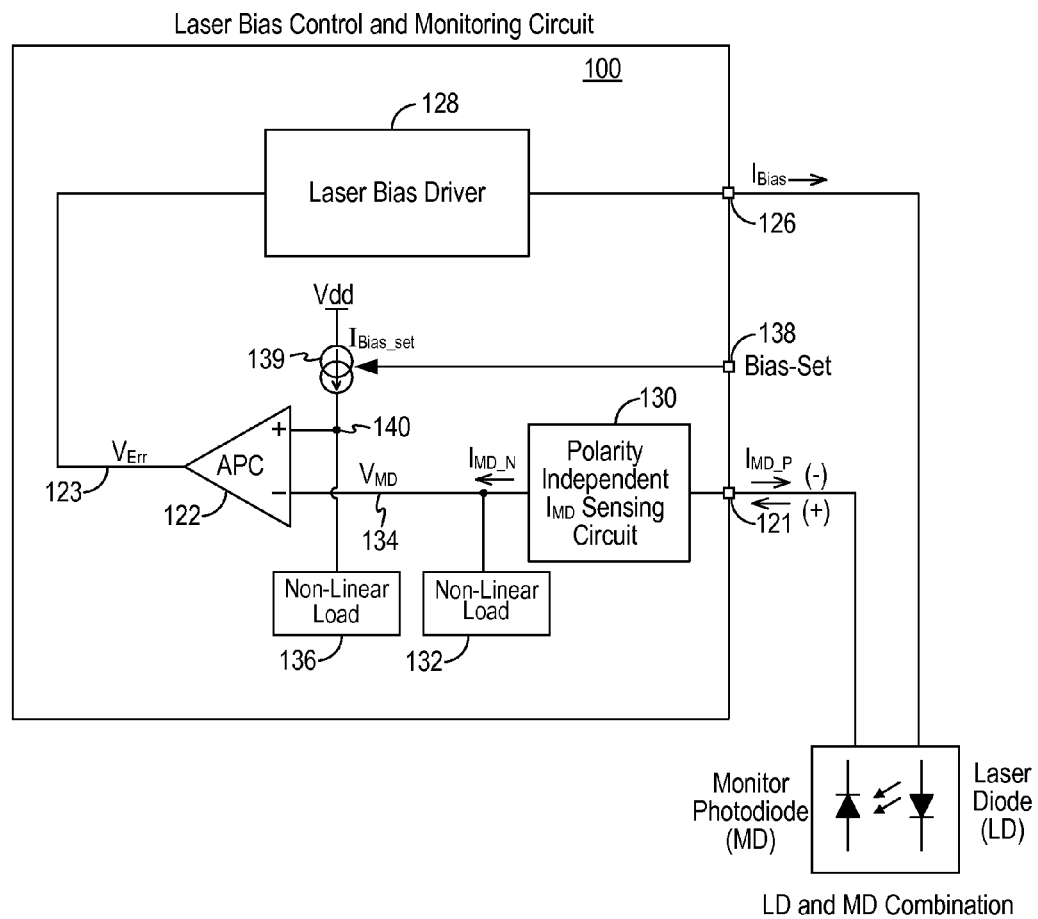
FIG. 4 is a schematic diagram of a laser bias control and monitoring circuit according to one embodiment of the present invention.

FIG. 4 is a schematic diagram of a laser bias control and monitoring circuit according to one embodiment of the present invention. Referring to FIG. 4, a laser bias control and monitoring circuit ("monitoring circuit") 100 generates a bias current $I_{Bias}$ (node 126) to bias the laser diode (LD) to a desired operating level. The monitoring circuit 100 includes an APC circuit implementing an automatic power control (APC) loop to adjust the bias current $I_{Bias}$ to the desired level.

In the automatic power control (APC) loop of the monitoring circuit 100, the APC loop receives a signal indicative of the laser diode output optical power and the APC loop adjusts the bias current value in a manner to maintain the desired average output power level. In practice, the laser diode output optical power is measured using a monitor photodiode or a monitor diode (MD) placed in close proximity to the laser diode. The monitor diode generates a monitor diode current $I_{MD}$ indicative of the laser output optical power. The monitor diode current generated by the monitor diode is provided to the APC loop for monitoring and adjusting the bias current thereof.

In a laser driver system the laser diode and monitor diode can be connected in different configurations, such as the common anode configuration (FIG. 1(a)) and the common cathode configuration (FIG. 1(b)). The laser diode and monitor diode can also be configured to take the monitor diode current from either the anode or the cathode of the monitor diode or to reference the monitor diode current to ground or to the positive power supply (FIG. 1(c) and FIG. 1(d)). Therefore, the monitor diode current $I_{MD}$ generated by the monitor diode can have a positive polarity or a negative polarity depending on the direction of the current flow into or out of the current input node. In accordance with the present invention, the monitoring circuit 100 includes a polarity independent monitor diode current ($I_{MD}$) sensing circuit ("sensing circuit") 130 for receiving the monitor diode current $I_{MD}$ on a current input node 121 in either positive or negative polarity. That is, the sensing circuit 130 can receive monitor diode current $I_{MD}$ that flows into (positive) or out of (negative) the current input node 121.

In an optical system, the laser bias control and monitoring circuit 100 is used to provide and control the bias current for the laser diode and monitor the laser output optical power level. The optical system will further include a laser diode driver, such as laser diode driver 15 in FIG. 2, for providing a modulation current $I_{Mod}$ to modulate the output power of the laser diode in accordance with an input data signal. The laser diode driver is not shown in FIG. 4 for simplicity. The laser bias control and monitoring circuit 100 of the present invention can be coupled to work with any laser diode driver circuits. The exact implementation of the laser diode driver circuit for providing the modulation current is not critical to the practice of the present invention.

Referring again to FIG. 4, the construction and operation of the laser bias control and monitoring circuit 100 will now be described. The APC circuit of the monitoring circuit 100 is implemented using a voltage comparator 122 that compares a Bias-Set voltage signal (node 140) indicative of a Bias-Set signal (node 138) indicating the desired laser bias level and a monitor voltage signal $V_{MD}$ (node 134) indicative of the measured average output power of the laser diode. In the present embodiment, a Bias-Set signal, setting the desired bias level for the laser diode, is received on the input node 138 and is used to control a current source 139 providing a current $I_{Bias\_set}$ corresponding to the Bias-Set signal. The current $I_{Bias\_set}$ is converted to a voltage signal by a resistive load and the resultant Bias-Set voltage signal (node 140) is coupled to the positive input terminal of the voltage comparator 122. In the present embodiment, the current $I_{Bias\_set}$ is converted to the Bias-Set voltage signal using a non-linear load circuit 136. The advantage of using the non-linear load circuit 136 will be described in more detail below. In other embodiments, a linear load circuit or any resistive load circuit can be used to convert the Bias-Set current signal into a Bias-Set voltage signal.

The monitor current $I_{MD}$ is received by the polarity independent monitor diode current sensing circuit 130. In particular, the sensing circuit 130 is coupled to receive the monitor diode current in either a positive polarity (flowing into input node 121) or a negative polarity (flowing out of input node 121). In the present description, the monitor diode current received at the current input node 121 having different current polarities will be referred to as multi-polarity monitor diode current and denoted as $I_{MD\_P}$. The sensing circuit 130 takes the positive or negative polarity monitor diode current $I_{MD\_P}$ and generates a normalized monitor diode current $I_{MD\_N}$ having a magnitude that reflects the relative absolute magnitude of the incoming monitor current $I_{MD\_P}$ without regard to sign or polarity of the input current. By using the polarity independent monitor diode current sensing circuit 130, the laser bias control and monitoring circuit 100 can be coupled to a laser diode and a monitor diode combination having different configurations.

In sensing circuit 130, the normalized monitor diode current $I_{MD\_N}$ is coupled to a resistive load or other types of load to be converted to the monitor voltage signal $V_{MD}$ (node 134). In the present embodiment, the current $I_{MD\_N}$ is converted to the monitor voltage signal using a non-linear load circuit 132. The advantage of using the non-linear load circuit 132 will be described in more detail below. In other embodiments, the normalized monitor diode current $I_{MD\_N}$ is coupled to a linear load circuit or any resistive load circuit to be converted to the monitor voltage signal.

The monitor voltage signal $V_{MD}$ is coupled to the negative input terminal (node 134) of the voltage comparator 122. The voltage comparator 122 compares the Bias-Set voltage signal to the monitor voltage signal to determine if the actual output power of the laser diode deviates from the selected bias level. An error signal $V_{Err}$ (node 123) is generated indicative of the difference between the Bias-Set voltage signal and the monitor voltage signal. The error signal $V_{Err}$ is provided to a laser bias driver 128 to generate the appropriate bias current $I_{Bias}$ to drive the laser diode. The exact implementation of the laser bias driver 128 is not critical to the practice of the present invention. In general, the laser bias driver 128 includes an amplifier receiving the error signal and comparing the error signal with a reference signal and a drive transistor. In some embodiments, the laser bias driver 128 can be implemented as shown in FIGS. 2 and 3 and may include an amplifier 24 and an appropriate drive transistor M1N or M1P.

In monitoring circuit 100 of FIG. 4, the APC loop is implemented using a voltage comparator and the monitor diode current and the Bias-Set current have to be converted to a voltage value for comparison at the voltage comparator. When converting a current value to a voltage value, there is often a trade-off between resolution and dynamic range. For instance, the monitor diode current can have a very large current range, such as from 1 μA to 1.5 mA. When converting the monitor diode current to a voltage value, a fine resolution at the low current range is required while a large dynamic range for the large current range is required. A method for performing current-to-voltage conversion using a non-linear impedance circuit to increase the dynamic range of the conversion while preserving the desired resolution is described in U.S. Pat. No. 7,738,519, which patent is incorporated herein by reference in its entirety.

In the present embodiment, the non-linear load circuit 132 (or a non-linear impedance circuit) is used to convert the normalized monitor diode current $I_{MD\_N}$ into the monitor voltage signal $V_{MD}$. To provide symmetry, the non-linear load circuit 136 is used to convert the Bias-Set current signal $I_{Bias\_set}$ into the Bias-Set voltage signal. The non-linear load circuits 132 and 136 enable the APC loop to expand the dynamic range of the current measurement while preserving the conversion resolution. In this manner, the monitoring circuit APC loop can handle a monitor diode current with a large dynamic current range. The use of non-linear load circuits 132, 136 is optional and they may be replaced with linear load or resistive load circuits in other embodiments of the present invention.

In the present description, a non-linear impedance circuit or a non-linear load circuit refers to a circuit that has a non-linear current-to-voltage transfer function. The non-linear load circuits 132 and 136 in monitoring circuit 100 operate to provide a non-linear current-to-voltage transfer function so that the dynamic range of the current-to-voltage conversion is increased without sacrificing the resolution of conversion.

Figure 5:
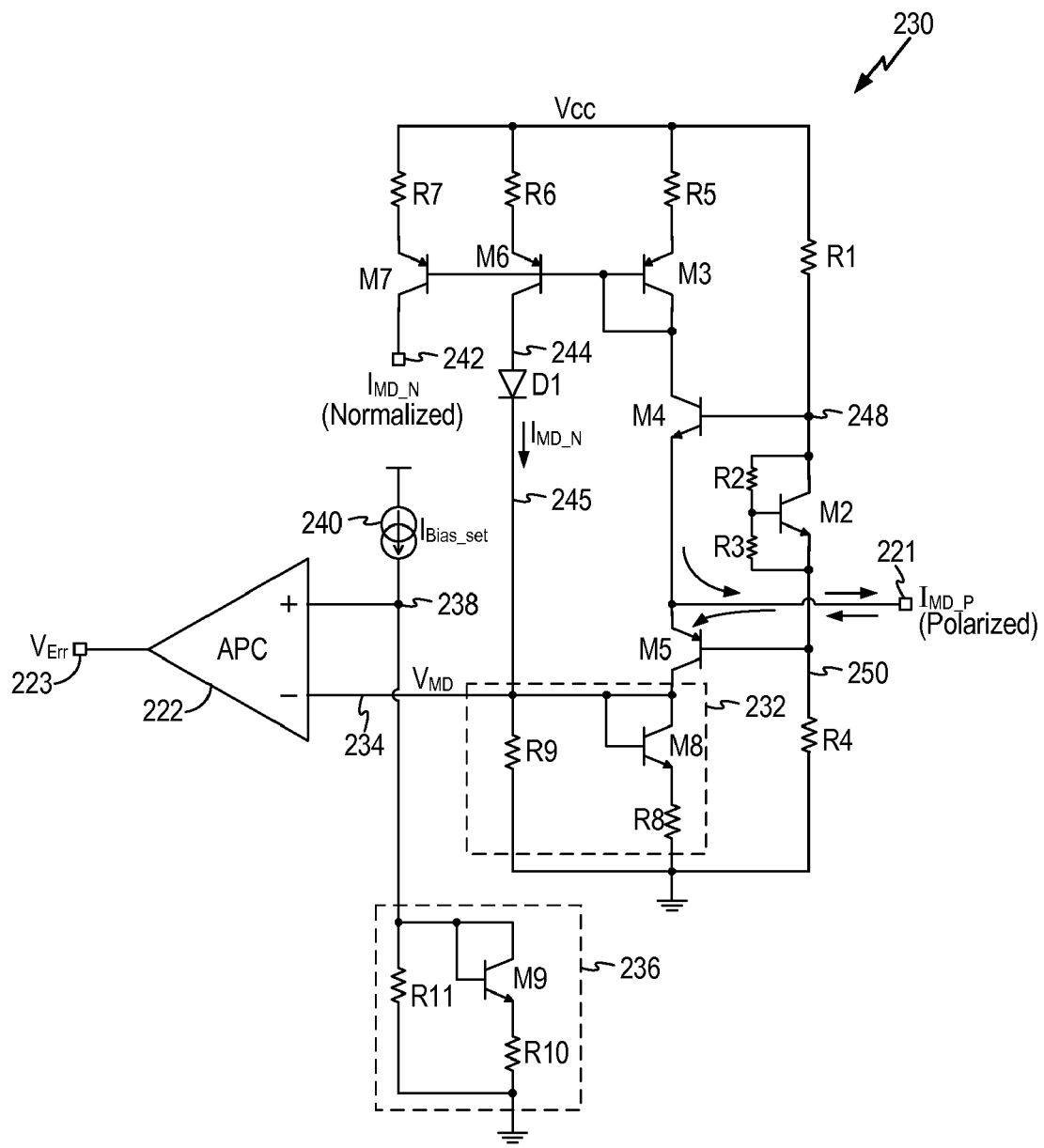
FIG. 5 is a circuit diagram of a polarity independent monitor diode current sensing circuit using bipolar transistors according to a first embodiment of the present invention.

FIG. 5 is a circuit diagram of a polarity independent monitor diode current sensing circuit using bipolar transistors according to a first embodiment of the present invention. FIG. 5 further illustrates the subsequent connection of the polarity independent monitor diode current sensing circuit to the automatic power control (APC) circuit. Referring to FIG. 5, the polarity independent monitor diode current sensing circuit ("current sensing circuit") 230 includes a current input node 221 being coupled to receive a multi-polarity monitor diode current $I_{MD\_P}$, which can have either positive or negative current polarity.

When the monitor diode current $I_{MD\_P}$ is positive, the monitor diode current flows into input node 221 and into the emitter terminal of a PNP transistor M5. The emitter current flows through transistor M5 to become the collector current. The collector current of transistor M5 is the normalized monitor diode current $I_{MD\_M}$. The collector current of transistor M5 flows into a non-linear load circuit 232 to develop the monitor voltage $V_{MD}$ at node 234.

On the other hand, when the monitor diode current $I_{MD\_P}$ is negative, the monitor diode current is sourced from the emitter terminal of an NPN transistor M4 and flows out of input node 221. The emitter current sourced out of transistor M4 in turn causes a collector current to flow in transistor M4. The collector current flowing through transistor M4 is mirrored by a PNP transistor M3 with a resistor R5 into a PNP transistor M6 with a resistor R6. The mirrored current at node 244 flows through a diode D1 as the normalized monitor diode current $I_{MD\_N}$ (node 245). The normalized monitor diode current $I_{MD\_M}$ at node 245 then flows through the non-linear load circuit 232, developing the monitor voltage $V_{MD}$ at node 234. Additional mirrored slaves, such as PNP transistor M7 and resistor R7, may be added to mirror from the mirror source formed by transistor M3 and resistor R5 so as to generate additional copies of the normalized monitor diode current $I_{MD\_N}$ for use in other circuitry.

The monitor voltage $V_{MD}$ at node 234, generated by either the positive or the negative monitor diode current, is used by the APC circuit 222 which compares voltage $V_{MD}$ with the $I_{Bias\_Set}$ voltage drop at node 238. The difference in the voltage between nodes 234 and 238 in turn is amplified by the APC circuit 222 to develop the error voltage $V_{ERR}$ at node 223.

In the present embodiment, the normalized monitor diode current $I_{MD\_N}$ (node 244) from the mirrored slave of transistors M6 flows through the diode D1 into the non-linear load circuit 232. Diode D1 is provided to limit current flow in the forward bias direction only. The non-linear load circuit 232 is formed by a resistor R9, an NPN transistor M8 with a resistor R8 connected to the emitter terminal of transistor M8. As a result of supplying the normalized monitor diode current $I_{MD\_N}$ to the non-linear load 232, a monitor voltage signal $V_{MD}$ (node 234) is generated indicative of the absolute magnitude of the monitor diode current $I_{MD}$. To preserve symmetry, a non-linear load circuit 236 is coupled to the Bias-Set current signal $I_{Bias\_Set}$ represented by a current source 240. The non-linear load circuit 236 is formed by a resistor R11, an NPN transistor M9 with a resistor R10 connected to the emitter terminal of transistor M9. The non-linear load 236 converts the Bias-Set current signal $I_{Bias\_Set}$ into a Bias-Set voltage signal (node 238). The Bias-Set voltage signal, thus converted, and the monitor voltage signal are provided to the APC error amplifier 222 to generate the error signal $V_{Err}$ (node 223) for controlling the bias level of the laser diode. The non-linear load circuits and the APC error amplifier are not part of the sensing circuit 230 but are included in FIG. 5 to illustrate the relationship of the circuit elements in the APC loop.

In the present embodiment, the non-linear load circuits 232 and 236 are constructed in the same manner to provide a matching non-linear current-to-voltage conversion. In particular, for symmetry purpose, non-linear load circuits 232 and 236 are implemented using resistors having the same corresponding resistance values. That is, the resistance values of resistors R9 and R11 are the same while the resistance values of resistors R8 and R10 are the same. In this manner, non-linear load circuits 232 and 236 have the same current-voltage characteristics or the same current-to-voltage transfer function. In this manner, the bias set voltage signal is generated using the same non-linear current-to-voltage transfer function as the monitor voltage signal $V_{MD}$. In other embodiments, non-linear load circuits 232 and 236 can have current-to-voltage transfer functions that are scaled versions of each other. That is, the resistance values of one of the non-linear load circuit can be scaled values of the other non-linear load circuit. This allows current $I_{Bias\_set}$ to be any given ratio of current $I_{MD\_P}$ and still control the APC function.

Figure 6:
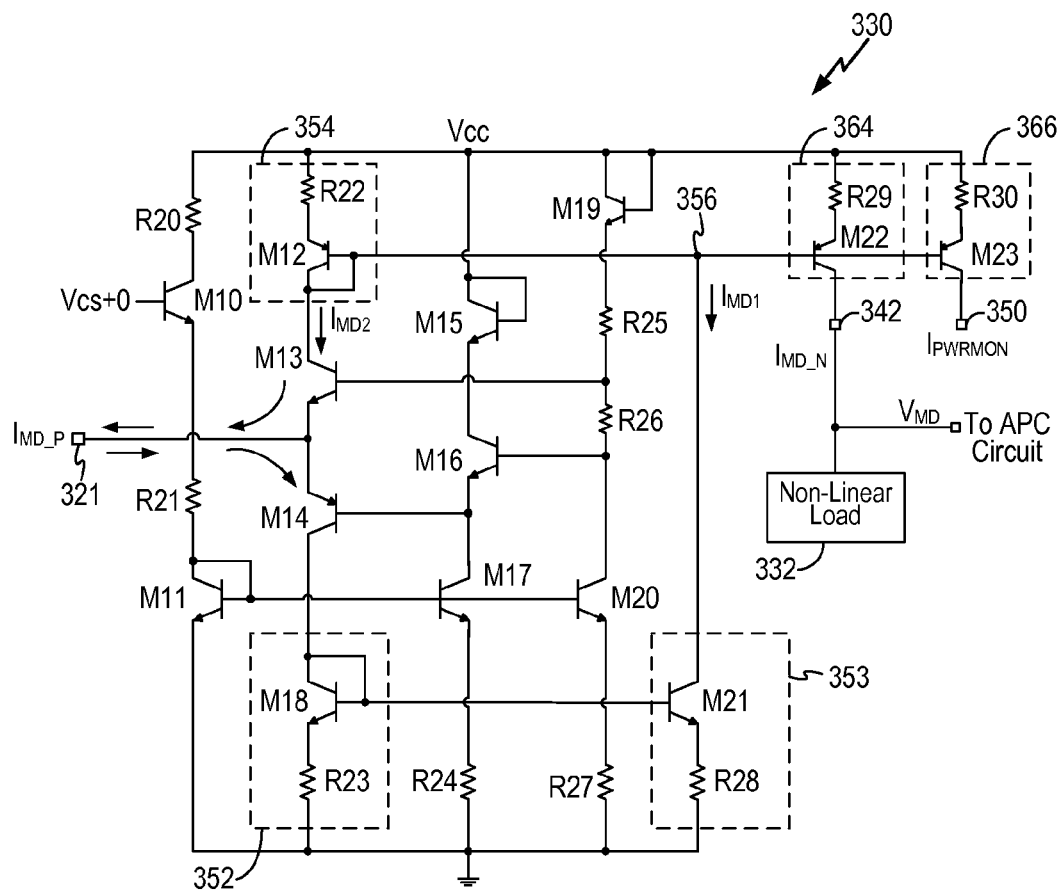
FIG. 6 is a circuit diagram of a polarity independent monitor diode current sensing circuit using bipolar transistors according to a second embodiment of the present invention.

FIG. 6 is a circuit diagram of a polarity independent monitor diode current sensing circuit using bipolar transistors according to a second embodiment of the present invention. FIG. 6 further illustrates a multi-polarity $I_{MD\_P}$ current being normalized to a normalized $I_{MD\_N}$ current. Referring to FIG. 6, the polarity independent monitor diode current sensing circuit ("current sensing circuit") 330 includes a current input node 321 being coupled to receive a multi-polarity monitor diode current $I_{MD\_P}$ in either positive or negative current polarity.

When the monitor diode current $I_{MD\_P}$ is positive, the monitor diode current flows into input node 321 and into the emitter terminal of a PNP transistor M14. The emitter current flows through transistor M14 to become the collector current. The collector current from transistor M14 is mirrored by a current mirror formed by an NPN mirror source 352 and an NPN mirrored slave 353 into a current $I_{MD1}$ at a node 356. NPN mirror source 352 is formed by an NPN transistor M18 with a resistor R23 and NPN mirrored slave 353 is formed by an NPN transistor M21 with a resistor R28. In this manner, the collector current flowing through transistor M14 is reflected by transistor M18 and resistor R23 to transistor M21 and resistor R28. Current $I_{MD1}$ is then generated at node 356 (the collector terminal of transistor M21) having a magnitude proportional to the absolute magnitude of the incoming monitor diode current $I_{MD\_P}$.

The current $I_{MD1}$ goes to a PNP mirror source 354 which then mirrors the current into a PNP mirrored slave 364 to generate the normalized monitor diode current $I_{MD\_N}$ at a node 342. PNP mirror source 354 is formed by a PNP transistor M12 and a resistor R22 while PNP mirrored slave 364 is formed by PNP transistor M22 and resistor R29. If more copies of the normalized monitor diode current $I_{MD\_N}$ are needed for other circuitry of the laser drive system, additional PNP mirrored slaves can be added and mirrored from PNP mirror source 354 to generate further copies of the normalized monitor diode current $I_{MD\_N}$. In the present embodiment, another copy of the normalized monitor diode current $I_{MD\_N}$ is generated at a node 350 by coupling a PNP mirrored slave 366, formed by PNP transistor M23 and resistor R30, to mirror the current from the PNP mirror source 354. In the present embodiment, the normalized monitor diode current at node 350 is denoted as current $I_{PWRMON}$ and is used as a measure of the optical output power or used as an indicator that the laser diode is outputting optical power.

On the other hand, when the monitor diode current $I_{MD\_P}$ is negative, the monitor diode current is sourced from the emitter terminal of an NPN transistor M13 and flows out of input node 321. The emitter current sourced out of transistor M13 in turn causes a collector current to flow in transistor M13. The collector current $I_{MD2}$ flowing through transistor M13 is supplied to the PNP mirror source 354 formed by PNP transistor M12 with resistor R22. The monitor diode current $I_{MD2}$ is then steered to one or more copies of the normalized monitor diode current $I_{MD\_N}$ through mirrored slaves 364, 366 cooperating with the PNP mirror source 354, in the same manner as described above.

In the present embodiment, resistors R22, R29 and R30 have the same resistance values or are ratios of each other to mirror the currents $I_{MD1}$ and $I_{MD2}$. The remaining circuitry in sensing circuit 330 establishes the bias for the various transistors.

In the present invention, the normalized monitor diode current $I_{MD\_N}$ at node 342 is used by the laser bias control and monitoring circuit to regulate the transmit power of the laser diode. That is, the normalized monitor diode current $I_{MD\_N}$ at node 342 is used to control the bias current supplied to the laser diode. Accordingly, the normalized monitor diode current $I_{MD\_N}$ is coupled to a non-linear load 332 to generate the monitor voltage signal $V_{MD}$. The monitor voltage signal can then be supplied to the APC circuit for controlling the bias current of the laser diode.

Other copies of the normalized monitor diode current $I_{MD\_N}$ can be used as a current or a voltage proportional to the optical power from the laser diode for other applications in the optical system. For example, the normalized monitor diode current at node 350 can be used to as an optical power monitor or for transmit signal detection or other functions.

Figure 7:
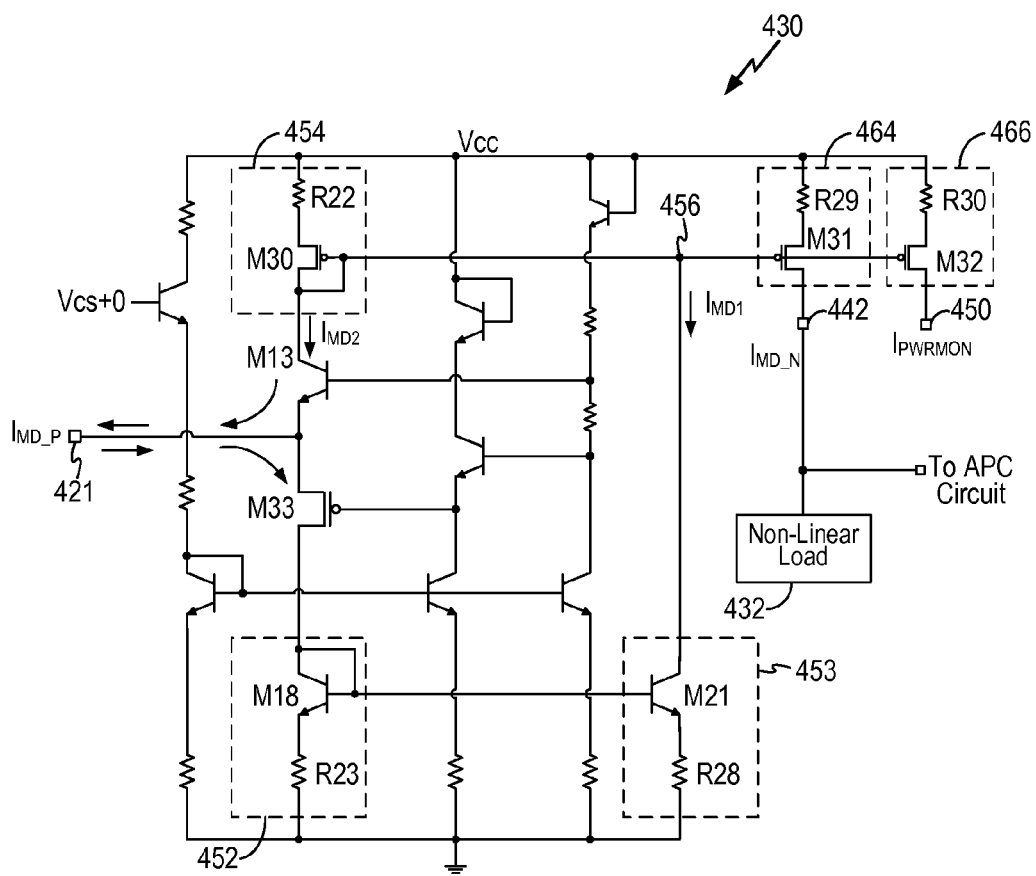
FIG. 7 is a circuit diagram of a polarity independent monitor diode current sensing circuit using bipolar and CMOS transistors according to a third embodiment of the present invention.

In the above-described embodiment, the polarity independent monitor diode current sensing circuit ("current sensing circuit") 330 is implemented using bipolar transistors only. In other embodiments, the polarity independent monitor diode current sensing circuit can be implemented using bipolar and CMOS transistors in a BiCMOS fabrication technology. FIG. 7 is a circuit diagram of a polarity independent monitor diode current sensing circuit using bipolar and CMOS transistors according to a third embodiment of the present invention. FIG. 7 further illustrates a multi-polarity $I_{MD\_P}$ current being normalized to a normalized $I_{MD\_N}$ currents using a BiCMOS fabrication process. Referring to FIG. 7, a polarity independent monitor diode current sensing circuit ("current sensing circuit") 430 includes a current input node 421 being coupled to receive a multi-polarity monitor diode current $I_{MD\_P}$ in either positive or negative current polarity. Current sensing circuit 430 is constructed in the same manner as current sensing circuit 330 of FIG. 6 except that CMOS transistors M30 to M33 are used to replace the respective bipolar transistors M12, M22, M23 and M14.

More specifically, a PMOS transistor M33 is used to receive the monitor diode current $I_{MD\_P}$ when the monitor diode current is positive. Furthermore, instead of the PNP current mirrors used in sensing circuit 330 of FIG. 6, PMOS current mirrors are used to mirror the current $I_{MD1}$ from node 456 and the current $I_{MD2}$ from the collector of transistor M13. To that end, a PMOS current mirror formed by a PMOS transistor M30 with a resistor R22 as the PMOS mirror source 454 and a PMOS transistor M31 with a resistor M29 as the PMOS mirrored slave 464 provides the normalized monitor diode current $I_{MD\_N}$ at a node 442. The normalized monitor diode current $I_{MD\_N}$ at node 442 can be coupled to a non-linear load circuit 432 to generate the monitor voltage signal for an APC circuit for use in controlling the bias level of a laser diode. Additional copies of the normalized monitor diode current $I_{MD\_N}$ can be generated by adding additional mirrored slaves cooperating with PMOS mirror source 454 (PMOS transistor M30 and resistor R22). For instance, PMOS transistor M32 with resistor R30 can be added to form another mirrored slave 466 to mirror another copy of the normalized monitor diode current $I_{MD\_N}$ at a node 450. In the present embodiment, the normalized monitor diode currentat node 450 is denoted as current $I_{PWRMON}$ and is used as a measure of the optical output power or used as an indicator that the laser diode is outputting optical power.

In other embodiments, the current sensing circuit described above can be used as a current normalization circuit which take an input current of any polarity—whether flowing into or out of the circuit—and normalize the current to a single current that is proportional to the magnitude of the incoming current and reflects the relative absolute value of the input current without regard to sign or polarity of the input current. In one embodiment, a current sensing circuit is polarity independent and can receive an input current on a current input node in a positive polarity (flowing into the input node) or a negative polarity (flowing out of the input node). The circuit converts the undefined polarity current into a normalized current which can then be used by other circuitry to process the current. The current sensing circuit can accept either polarity of input current without requiring reconfiguration or reprogramming.

The above detailed descriptions are provided to illustrate specific embodiments of the present invention and are not intended to be limiting. Numerous modifications and variations within the scope of the present invention are possible. The present invention is defined by the appended claims.

We claim:

1. A laser bias control and monitoring circuit configured to receive a monitor diode current on an input node indicative of the average optical output power of a laser diode and generate a bias current for the laser diode on an output node, the monitor diode current flowing into (positive polarity) or out of (negative polarity) the input node, the laser bias control and monitoring circuit comprising:
   a polarity independent current sensing circuit configured to receive the monitor diode current in either the positive or negative polarity and to generate a normalized output current having a magnitude proportional to a magnitude of the monitor diode current;
   a first load circuit configured to convert the normalized output current into a monitor voltage signal;
   a second load circuit configured to convert a bias set current signal into a bias set voltage signal, the bias set current signal being indicative of a desired value of the bias current generated to bias the laser diode;
   a comparator configured to compare the monitor voltage signal with the bias set voltage signal, the comparator providing an error signal indicative of a difference between the monitor voltage signal and the bias set voltage signal; and
   an amplifier configured to receive the error signal and a reference signal and to generate a bias adjust signal for adjusting the bias current for the laser diode.

2. The circuit of claim 1, wherein:
   the first load circuit comprises a first non-linear load circuit configured to receive the normalized output current and generate the monitor voltage signal using a first non-linear current-to-voltage transfer function; and
   the second load circuit comprises a second non-linear load circuit configured to receive the bias set current signal and generate the bias set voltage signal, the second non-linear load circuit being implemented using the first non-linear current-to-voltage transfer function or a scaled version of the first non-linear current-to-voltage transfer function.

3. The circuit of claim 1, wherein polarity independent current sensing circuit comprises:
   a first bipolar transistor having an emitter terminal coupled to the input node, a collector terminal coupled to a current mirror, and a base terminal biased to a first voltage,
   wherein when the monitor diode current has a negative polarity, the monitor diode current is sourced out of the emitter terminal of the first bipolar transistor.

4. The circuit of claim 3, wherein the first bipolar transistor comprises an NPN bipolar transistor.

5. The circuit of claim 1, wherein polarity independent current sensing circuit comprises:
   a second bipolar transistor having an emitter terminal coupled to the input node, a collector terminal coupled to a current mirror, and a base terminal biased to a second voltage,
   wherein when the monitor diode current has a positive polarity, the monitor diode current flows into the emitter terminal of the second bipolar transistor.

6. The circuit of claim 5, wherein the second bipolar transistor comprises a PNP bipolar transistor.

7. The circuit of claim 1, wherein polarity independent current sensing circuit comprises:
   a first MOS transistor having a first current terminal coupled to the input node, a second current terminal coupled to a current minor, and a gate terminal biased to a second voltage,
   wherein when the monitor diode current has a positive polarity, the monitor diode current flows into the first current terminal of the first MOS transistor.

8. The circuit of claim 7, wherein the first MOS transistor comprises a PMOS transistor.

9. The circuit of claim 1, wherein the monitor diode current is generated by a monitor diode placed in close proximity to the laser diode, the monitor diode and the laser diode being configured in a common anode configuration.

10. The circuit of claim 1, wherein the monitor diode current is generated by a monitor diode placed in close proximity to the laser diode, the monitor diode and the laser diode being configured in a common cathode configuration.

11. The circuit of claim 1, wherein the monitor diode current is generated by a monitor diode placed in close proximity to the laser diode, the monitor diode current being provided out of the cathode of the monitor diode and the anode of the monitor diode being connect to a ground potential.

12. The circuit of claim 1, wherein the monitor diode current is generated by a monitor diode placed in close proximity to the laser diode, the monitor diode current being provided out of the anode of the monitor diode and the cathode of the monitor diode being connect to a positive power supply potential.

13. A method of controlling a bias current of a laser diode, comprising:
   providing a monitor diode current on an input node indicative of the average optical output power of a laser diode, the monitor diode current flowing into (positive polarity) or out of (negative polarity) the input node;

receiving the monitor diode current in either positive or negative polarity;

generating a normalized output current having a magnitude proportional to a magnitude of the monitor diode current;

converting the normalized output current to a monitor voltage signal;

providing a bias set voltage signal indicative of a desired value of the bias current generated to bias the laser diode;

comparing the monitor voltage signal to the bias set voltage signal to generate an error signal indicative of a difference between the monitor voltage signal and the bias set voltage signal; and generating a bias adjust signal for adjusting the bias current for the laser diode in response to the error signal.

14. The method of claim 13, wherein converting the normalized output current to a monitor voltage signal comprises:

converting the normalized output current to a monitor voltage signal using a first non-linear current-to-voltage transfer function.

15. The method of claim 13, wherein providing a bias set voltage signal indicative of a desired value of the bias current generated to bias the laser diode comprises:

providing a bias set current signal; and converting the bias set current signal to the bias set voltage signal using a second non-linear current-to-voltage transfer function being the same as the first non-linear current-to-voltage transfer function or a scaled version of the first non-linear current-to-voltage transfer function.

16. The method of claim 13, wherein providing a monitor diode current on an input node comprises:

generating the monitor diode current using a monitor diode placed in close proximity to the laser diode, the monitor diode and the laser diode being configured in a common anode configuration.

17. The method of claim 13, wherein providing a monitor diode current on an input node comprises:

generating the monitor diode current using a monitor diode placed in close proximity to the laser diode, the monitor diode and the laser diode being configured in a common cathode configuration.

18. The method of claim 13, wherein providing a monitor diode current on an input node comprises:

generating the monitor diode current using a monitor diode placed in close proximity to the laser diode, the monitor diode current being provided out of the cathode of the monitor diode and the anode of the monitor diode being coupled to a ground potential.

19. The method of claim 13, wherein providing a monitor diode current on an input node comprises:

generating the monitor diode current using a monitor diode placed in close proximity to the laser diode, the monitor diode current being provided out of the anode of the monitor diode and the cathode of the monitor diode being coupled to a positive power supply potential.

* * * * *

UNITED STATES PATENT AND TRADEMARK OFFICE
CERTIFICATE OF CORRECTION

PATENT NO.      : 8,320,420 B2  
APPLICATION NO. : 13/039297  
DATED           : November 27, 2012  
INVENTOR(S)     : Brown et al.

Page 1 of 1

It is certified that error appears in the above-identified patent and that said Letters Patent is hereby corrected as shown below:

Claim 7, Column 12, Line 35
delete "minor" insert --mirror--

Signed and Sealed this
Second Day of April, 2013

Teresa Stanek Rea
*Acting Director of the United States Patent and Trademark Office*